(12) United States Patent
Marceau et al.

(10) Patent No.: US 7,133,583 B2
(45) Date of Patent: Nov. 7, 2006

(54) FIBER OPTIC MECHANICAL/THERMAL TUNING AND ISOLATING DEVICE

(75) Inventors: David Marceau, Salt Lake City, UT (US); Dennis F. Elkins, Draper, UT (US); Forrest L. Williams, Sandy, UT (US); Allen H. Tanner, Sandy, UT (US)

(73) Assignee: Evans & Sutherland Computer Corporation, Salt Lake City, UT (US)

( * ) Notice: Subject to any disclaimer, the term of this patent is extended or adjusted under 35 U.S.C. 154(b) by 0 days.

(21) Appl. No.: 11/388,530

(22) Filed: Mar. 23, 2006

(65) Prior Publication Data

US 2006/0165338 A1 Jul. 27, 2006

Related U.S. Application Data

(60) Division of application No. 10/807,808, filed on Mar. 23, 2004, which is a continuation-in-part of application No. 10/017,162, filed on Dec. 14, 2001, now Pat. No. 6,763,042, and a continuation-in-part of application No. 10/383,909, filed on Mar. 6, 2003, now Pat. No. 6,868,212.

(51) Int. Cl.
*G02B 6/00* (2006.01)
*G02B 6/26* (2006.01)
(52) U.S. Cl. .................. 385/13; 385/31; 385/32
(58) Field of Classification Search .............. 385/13, 385/31, 32
See application file for complete search history.

(56) References Cited

U.S. PATENT DOCUMENTS

| 4,375,685 | A | * | 3/1983 | Le Goff et al. ............... 372/32 |
|---|---|---|---|---|
| 4,636,031 | A | | 1/1987 | Schmadel, Jr. et al. |
| 4,955,034 | A | * | 9/1990 | Scerbak ...................... 372/94 |
| 5,159,601 | A | | 10/1992 | Huber |
| 5,317,576 | A | | 5/1994 | Leonberger et al. |
| 5,536,085 | A | | 7/1996 | Li et al. |
| 5,691,999 | A | | 11/1997 | Ball et al. |
| 6,263,002 | B1 | | 7/2001 | Hsu et al. |
| 6,393,181 | B1 | | 5/2002 | Bulman et al. |
| 6,449,293 | B1 | | 9/2002 | Pedersen et al. |
| 6,452,667 | B1 | | 9/2002 | Fernald et al. |
| 6,470,036 | B1 | | 10/2002 | Bailery et al. |
| 6,480,513 | B1 | | 11/2002 | Kapany et al. |
| 6,490,931 | B1 | * | 12/2002 | Fernaid et al. ............... 73/705 |
| 6,519,388 | B1 | | 2/2003 | Fernald et al. |
| 6,534,248 | B1 | | 3/2003 | Jain et al. |
| 6,563,968 | B1 | | 5/2003 | Davis et al. |
| 2003/0086647 | A1 | * | 5/2003 | Willner et al. ............... 385/37 |

* cited by examiner

*Primary Examiner*—Kaveh Kianni
(74) *Attorney, Agent, or Firm*—Thorpe North & Western LLP

(57) ABSTRACT

A tunable fiber optic component providing environmental isolation, thermal tuning, and mechanical tuning and a method of tuning a fiber optic component using application of substantially simultaneous varying of temperature and mechanical strain is disclosed. A method of using a tunable fiber optic component, for example, a distributed feedback fiber laser, to compensate variations in an optical system, and a method of making a tunable fiber optic component are also disclosed.

19 Claims, 8 Drawing Sheets

FIBER OPTIC MECHANICAL/THERMAL TUNING AND ISOLATING DEVICE

The present application is a divisional of U.S. patent application Ser. No. 10/807,808, filed Mar. 23, 2004, which is a continuation-in-part of U.S. patent application Ser. No. 10/017,162, filed Dec. 14, 2001 now U.S. Pat. No. 6,763,042, and a continuation-in-part of U.S. patent application Ser. No. 10/383,909, filed Mar. 6, 2003 now U.S. Pat. No. 6,868,212.

BACKGROUND OF THE INVENTION

1. Field of the Invention

The present invention relates generally to tuning of optical fiber structures. More particularly, the present invention relates to tuning, protection, and environmental isolation of distributed feedback fiber lasers.

2. Related Art

Lasers have found use in a variety of applications, including displays, optical printing, optical recording, and communications. Distributed feedback (DFB) fiber lasers, in particular, have proven useful in those applications where the single-mode operation, narrow optical linewidth, and low noise performance of DFB fiber lasers are particularly advantageous. Tuning of DFB fiber laser optical frequency is generally required to correct initial manufacturing tolerances, and various fixed schemes to accomplish initial tuning are known. In many applications, very stable laser optical frequency is required, however, and maintaining long-term stability has proved challenging.

Controlled changes in temperature or controlled application of mechanical strain to the fiber may be used to tune the optical frequency of a DFB fiber laser. Changes in temperature and mechanical strain result in changes to the period of gratings impressed into the fiber resulting in a change in the optical frequency of the DFB fiber laser. Thermal tuning by adjusting the temperature of a DFB fiber laser is limited to slow laser optical frequency changes, however, due to slow change rates of the thermal mass of the fiber and associated temperature control mechanism.

Although mechanical tuning of a DFB fiber laser by the application of mechanical strain can accomplish rapid changes in the laser optical frequency, such tuning is difficult. The DFB fiber laser manufacturing process weakens the fiber permitting excessive tension to break the fiber. Similarly, wide range mechanical tuning of the fiber can reduce reliability due to the increased chance of fiber breakage. Although some of the problems associated with mechanical tuning can be avoided by limiting the applied mechanical strain to compression loading rather than tension, application of compression to a fiber is difficult to achieve without buckling the fiber. Hence, complex mechanical structures are required to prevent buckling when applying compression-only mechanical tuning.

SUMMARY OF THE INVENTION

It has been recognized that it would be advantageous to develop a technique to provide wide range and rapid tuning of the optical frequency of a fiber optic component simultaneously. Furthermore, it has been recognized that it would be advantageous to provide tuning of the optical frequency of a fiber optic component while also providing protection of the fiber optic component and isolation of the fiber optic component from acoustic vibration and mechanical shock. Furthermore, it is desirable to accomplish these objectives using a less complex structure than prior art mechanically tuned lasers.

The invention provides a fiber optic component tuning and isolating support device. The support device includes a tensioning structure in thermal contact with a thermal control structure which includes a thermally-conductive, acoustic-damping material and a thermally-controlled surface. In another embodiment, the invention provides a fiber optic component tuning and isolating support device which includes a thermally-conductive, acoustic-damping material in thermal contact with a thermally-controlled surface and configured to receive a fiber optic component. In another embodiment, the invention provides a fiber optic component tuning and isolating device which includes a tensioning structure encased in an acoustic-damping material.

The invention also provides a method of substantially simultaneously thermally and mechanically tuning a fiber optic component. Another embodiment of the invention also provides a method of compensating variations in an optical system by thermally and mechanically tuning the optical frequency of a DFB fiber laser.

Finally, the invention also provides a method of making a tunable fiber optic component by encasing a fiber optic component in a tensioning structure and affixing the tensioning structure to a thermally-controlled surface using a thermally-conductive, acoustic-damping material.

Additional features and advantages of the invention will be apparent from the detailed description which follows, taken in conjunction with the accompanying drawings, which together illustrate, by way of example, features of the invention.

DETAILED DESCRIPTION

Figure 1:
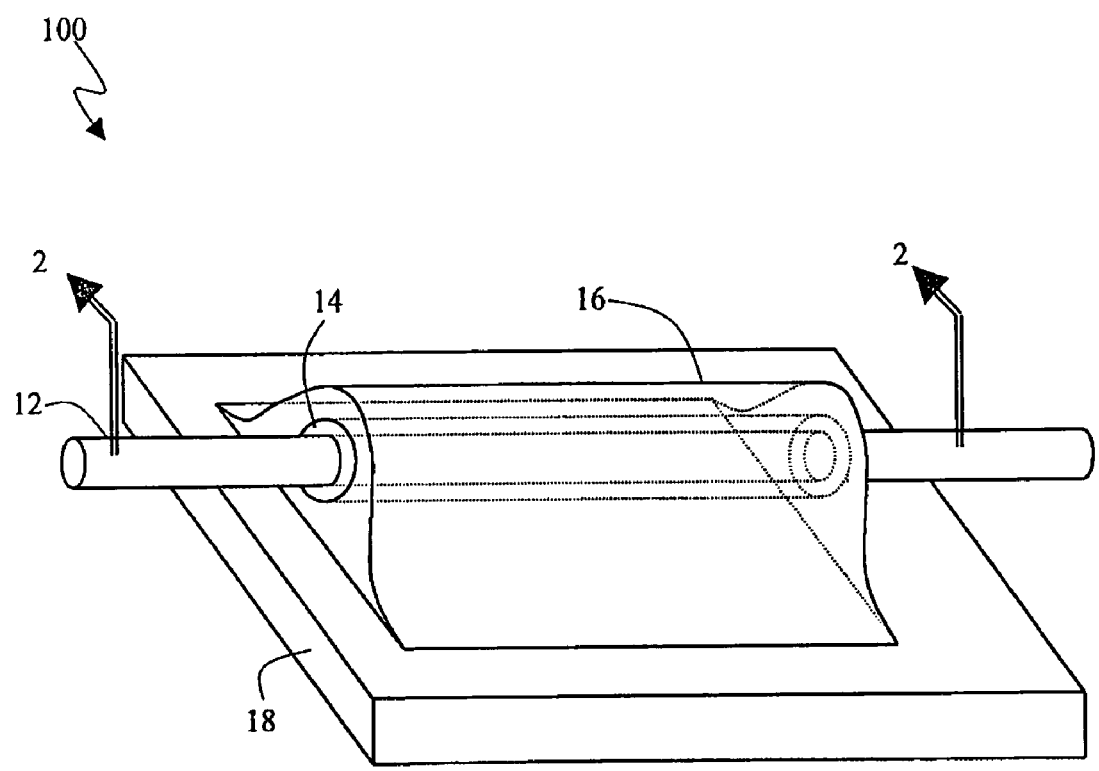
FIG. 1 is a perspective view of a simultaneously thermally and mechanically tunable fiber optic component with integrated physical protection and environmental isolation in accordance with an embodiment of the present invention.

Reference will now be made to the exemplary embodiments illustrated in the drawing, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

A system for simultaneous thermal tuning and mechanical tuning of a fiber optic component with integrated physical protection and environmental isolation, in accordance with an embodiment of the present invention, is illustrated in FIG. 1 and indicated generally at 100. The fiber optic component 12, for example, a DFB fiber laser, is attached to a tensioning structure 14. The tensioning structure is fabricated of an electrically-active, mechanically-responsive material so that the length of the tensioning structure may be changed by electrical activation.

In accordance with one aspect of the present invention, the tensioning structure 14 may be fabricated of a piezoelectric material 32 shaped in the form of a tube. As illustrated in FIGS. 2A, 2B, 2C, 2D, and 2E, electrodes may be applied to the inner 22 and outer 24 surfaces of the tensioning structure 14 along the tube's length, so that the tube is poled radially through its wall. The inner and outer electrodes are connected via leads 28 to a voltage source whereby mechanical tuning of the optical frequency of the laser may be accomplished by electrical activation of the piezoelectric material. The electrical activation causes the tensioning structure to vary in length in the longitudinal direction 26 according to the applied electrical signal. This in turn applies varying tension to the fiber optic component 12, causing a change in the length and optical frequency of the fiber optic component. For example, if the fiber optic component is a DFB fiber laser, the resonant frequency of the laser will be changed; if a Bragg grating the grating period will be changed.

This mechanical tuning using the tensioning structure 14 can provide small optical frequency changes of a DFB fiber laser up to a few GHz. The rate at which frequency changes may be tuned is quite rapid: tuning rates of up to several hundred kHz may be obtained, depending primarily on the mechanical frequency response of the tensioning structure, as is discussed further below.

Figure 2A:
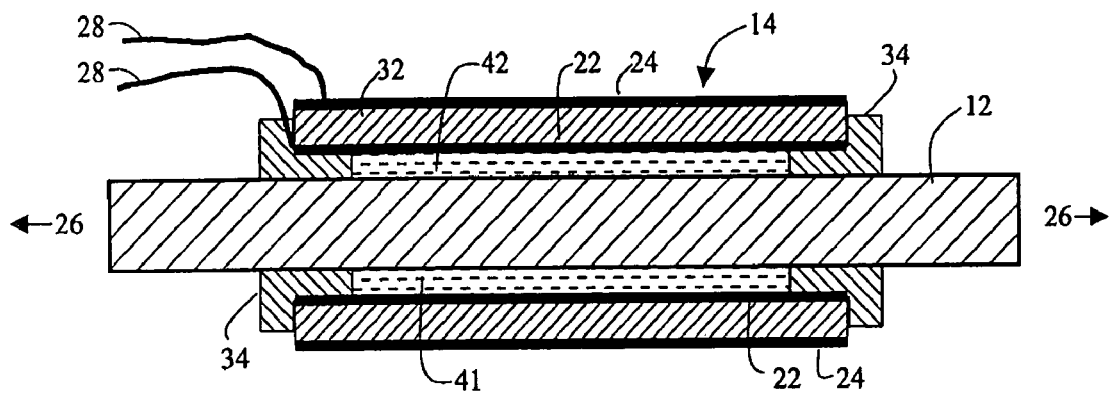
FIG. 2 is a cross sectional view of alternate embodiments of the tensioning structure of FIG. 1.
Figure 2B:
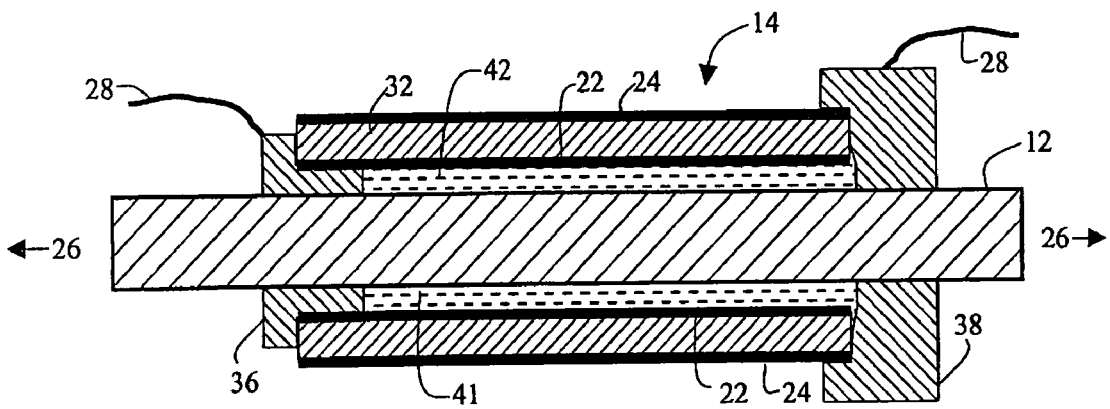

Further detail of the attachment of the fiber optic component 12 and electrical activation of the tensioning structure 14 is shown in the alternate embodiments illustrated in cross sectional views FIG. 2A through FIG. 2E. The fiber optic component may be attached to the ends of the tensioning structure using glue or clamps. For example, as illustrated in FIG. 2A, caps 34 may be installed at the ends of the tensioning structure and the fiber optic component glued to the caps. The caps may also used to provide electrical contact to the electrodes 22, 24. For example, as illustrated in FIG. 2B, contacting caps 36, 38, fabricated of an electrically conductive material, may be used to make electrical contact to the inner and outer electrodes.

Figure 2C:
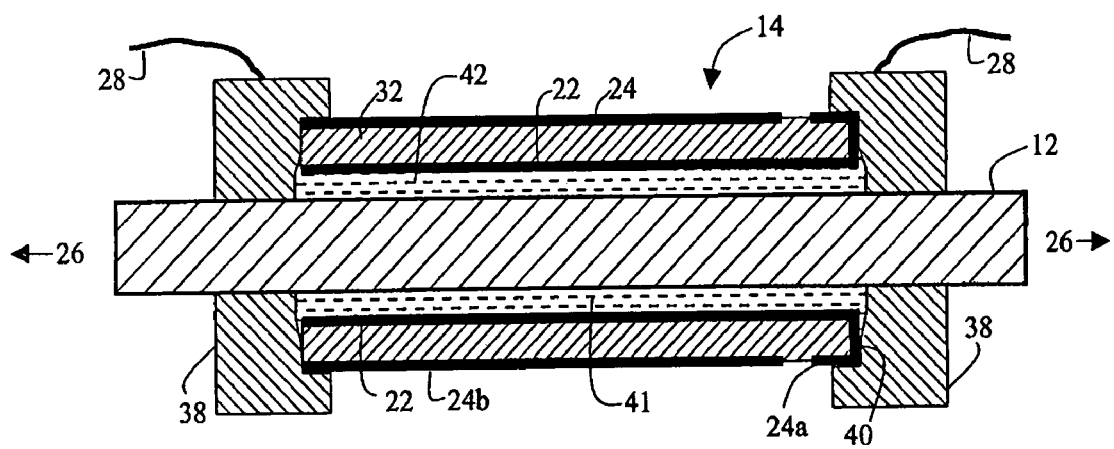

Alternately, as illustrated in FIG. 2C, the outer electrode can be split into two portions 24a, 24b and the inner electrode 22 may be electrically connected through end plating 40 to connect the inner electrode to part of the outer electrode 24a. Two outer contacting caps 38 make electrical contact to the outer electrode 24b and to the inner electrode 22 via end plating 40 and outer electrode part 24a. This arrangement permits the use of symmetric end caps.

Optionally, the area within the bore 41 of the tensioning structure 14 may be filled with a thermally-conductive, acoustic-damping material, such as oil 42. This will further enhance the acoustic isolation of the fiber optic component.

Figure 2D:
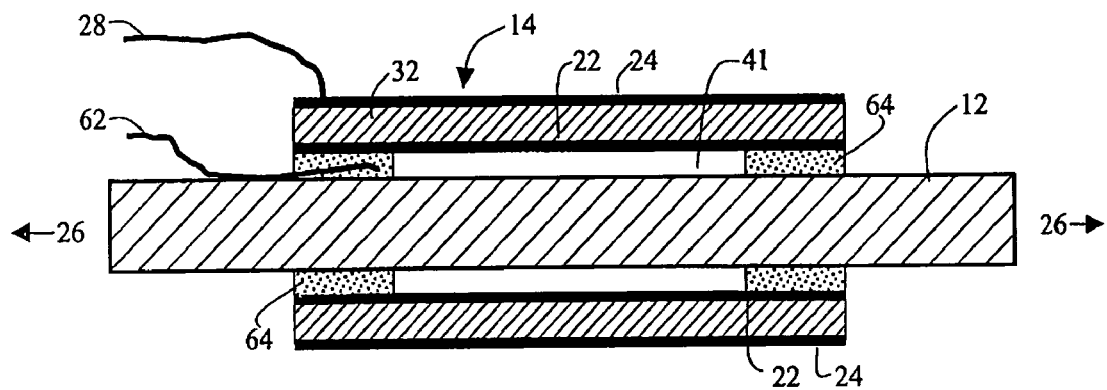
Figure 2E:
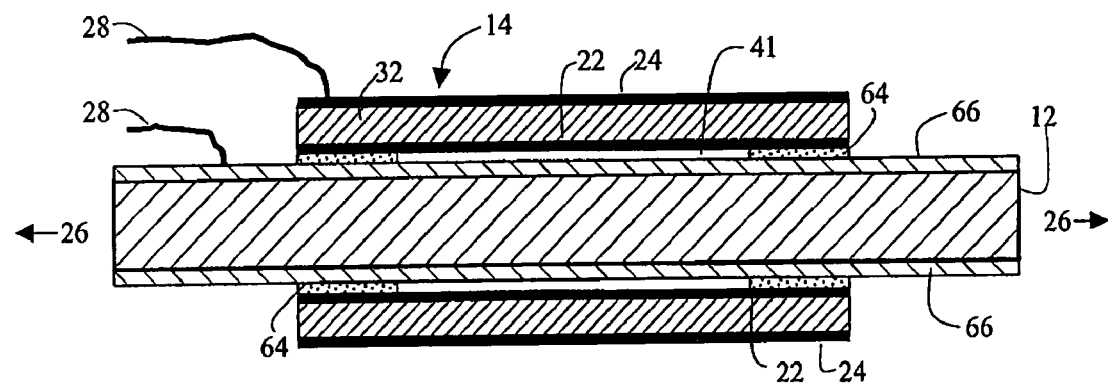

Various other arrangements of the electrical connection to the electrodes are also possible. As illustrated in FIG. 2D, connection to the inner electrode 22 may be accomplished by including a wire 62 with the fiber optic component 12 inside the tensioning structure 14. Electrical contact between the wire and the inner electrode is ensured by using a conductive epoxy 64, or similar, to secure the wire and fiber optic component within the bore 41 of the tensioning structure. The conductive epoxy also serves to bond the fiber optic component to the tensioning structure. Alternately, as illustrated in FIG. 2E, the fiber optic component may include a conductive jacket 66 which is used directly to connect to the inner electrode, again using a conductive epoxy, or similar material.

It is desirable that the tensioning structure extends longitudinally to completely encompass the active region of a DFB fiber laser to ensure that uniform stress is applied to the gratings of the DFB fiber laser and to fully protect the DFB fiber laser. If the tensioning structure is designed to enclose only a portion of the active region of a DFB fiber laser, this may result in poor efficiency or even bimodal output from the laser if stretched and unstretched portions of the DFB fiber laser have different grating periods.

Figure 3A:
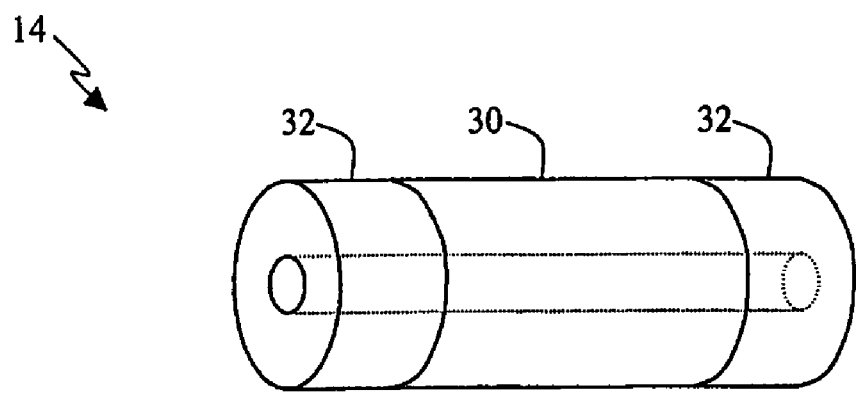
FIG. 3 is a perspective view of alternate embodiments of the tensioning structure of FIG. 1.
Figure 3B:
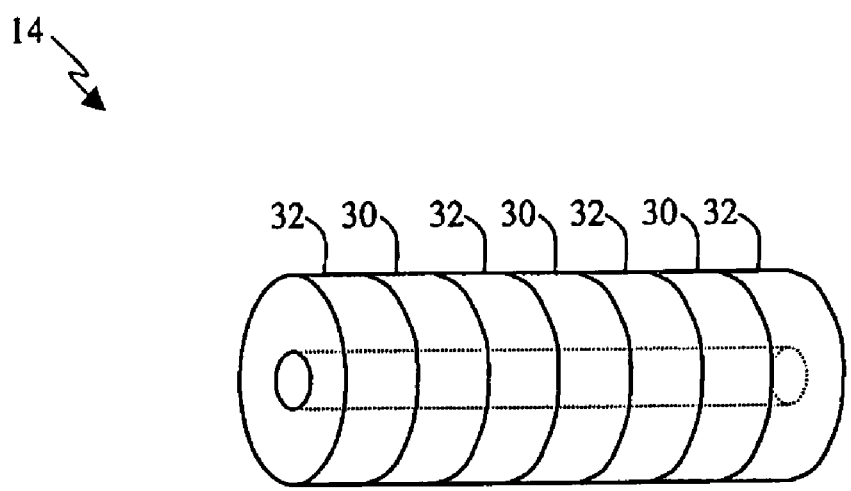

The tensioning structure 14 may be fabricated entirely of a piezoelectric or other similar material that provides electrically activated mechanical translation. Alternately, as shown in FIG. 3A, the tensioning structure may be fabricated from a rigid material 30, such as fused silica or alumina, in the center portion and a piezoelectric material 32 at the ends. Preferably, the fiber optic component is attached only to the piezoelectric material at the ends of such a composite tensioning structure to apply uniform mechanical strain to the longitudinal dimension of the fiber optic component. A composite structure as just described may, however, require higher applied voltages to the piezoelectric material to achieve the same longitudinal translation of the tensioning structure as the preferred embodiment. As another alternative, as shown in FIG. 3B, the tensioning structure may be fabricated of alternating sections of rigid 30 and piezoelectric material 32.

In accordance with another aspect of the present invention, thermal tuning of the optical frequency may be concurrently accomplished by varying the temperature of the fiber optic component with a thermal control structure. As illustrated in FIG. 1, the thermal control structure may be implemented using a thermally-controlled surface 18 thermally connected to the fiber optic component via a thermally-conductive, acoustic-damping material 16. Preferably, the thermally-conductive, acoustic-damping material is the sole means of attaching the tensioning structure to the thermally-controlled surface to ensure isolation of the fiber optic component and tensioning structure from acoustic vibration and mechanical shock. Various thermally-conductive, acoustic-damping materials are known in the art. Various techniques of creating a thermally-controlled surface are known in the art, including resistive heaters, thermoelectric coolers, heat pumps, or heat exchangers.

Thermal tuning using the thermally-controlled surface can provide large optical frequency changes up to several 100 GHz, complementing the narrower tuning range provided by mechanical tuning using the tensioning structure. The tuning rate of the thermally-controlled surface 18 is smaller than the mechanical tuning rate, allowing changing the optical frequency of the laser at tuning rates of up to about 5 Hz. Accordingly, the present invention provides both coarse tuning and fine tuning within the same structure.

The invention also solves problems inherent in trying to provide physical protection and environmental isolation of a tunable laser. The tensioning structure 14 provides physical protection to fragile fiber optic components. The tensioning structure may also provide the ability to mechanically tune the laser without requiring hard mounting of the fiber optic component to any other structure than the tensioning structure. The tensioning structure, containing the DFB fiber laser 12, may thus be mechanically isolated using thermally-conductive, acoustic-damping material 16. The acoustic-damping property isolates the DFB fiber laser from acoustic vibration and mechanical shock in the surrounding environment. The thermally-conductive property thermally couples the DFB fiber laser 12 to the thermally-controlled surface 18, ensuring that the DFB fiber laser 12 maintains substantially the same temperature as the thermally-controlled surface 18 and thus isolating the DFB fiber laser 12 from ambient environmental temperature changes. If temperature control is not required, an acoustic-damping material may be used instead of the thermally-conductive, acoustic-damping material. Conversely, if isolation from shock and vibration is not required, a thermally-conductive material may be used instead of the thermally-conductive, acoustic-damping material.

Although the DFB fiber laser 12 may respond to pressure changes in the environment, these changes are slow and can be compensated by the thermal tuning. Hence, environmental isolation from ambient temperature and mechanical shock and vibration is provided.

Figure 4:
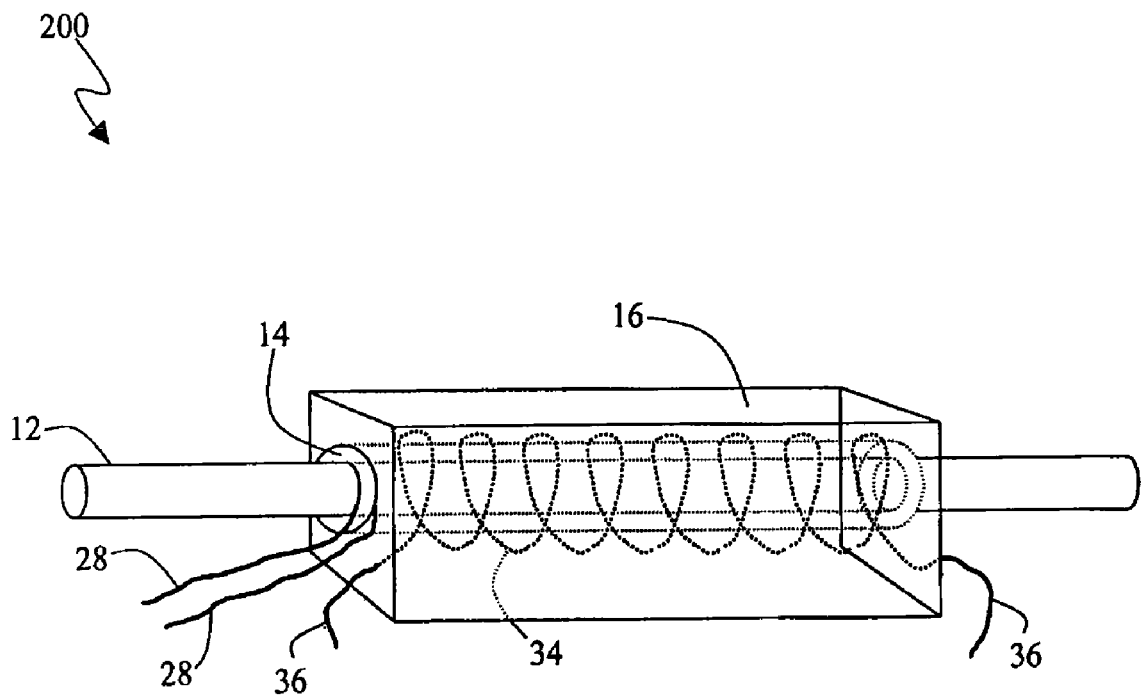
FIG. 4 is a perspective view of a simultaneously thermally and mechanically tunable fiber optic component with integrated physical protection and environmental isolation in accordance with an embodiment of the present invention.

An alternate embodiment of a system for simultaneous thermal tuning and mechanical tuning of a fiber optic component with integrated physical protection and environmental isolation is illustrated in FIG. 4 and indicated generally at 200. The fiber optic component 12 is placed within a tensioning structure 14, which is placed within a thermally-conductive, acoustic-damping material 16. Also placed within the thermally-conductive, acoustic-damping material 16 is a heater element 34. The heater element 34 may be connected by leads 36 to a voltage source which is used to control the temperature of the thermally-conductive, acoustic-damping material. The fiber optic component is in thermal contact with the heater element through the thermally-conductive, acoustic-damping material, hence tuning of the optical frequency of the DFB fiber laser 12 may be accomplished by electrical control of the heater element 34. A second set of leads 28 connected to the tensioning structure may be used to control the tensioning structure as previously discussed to accomplish mechanical tuning of the DFB fiber laser.

Figure 5:
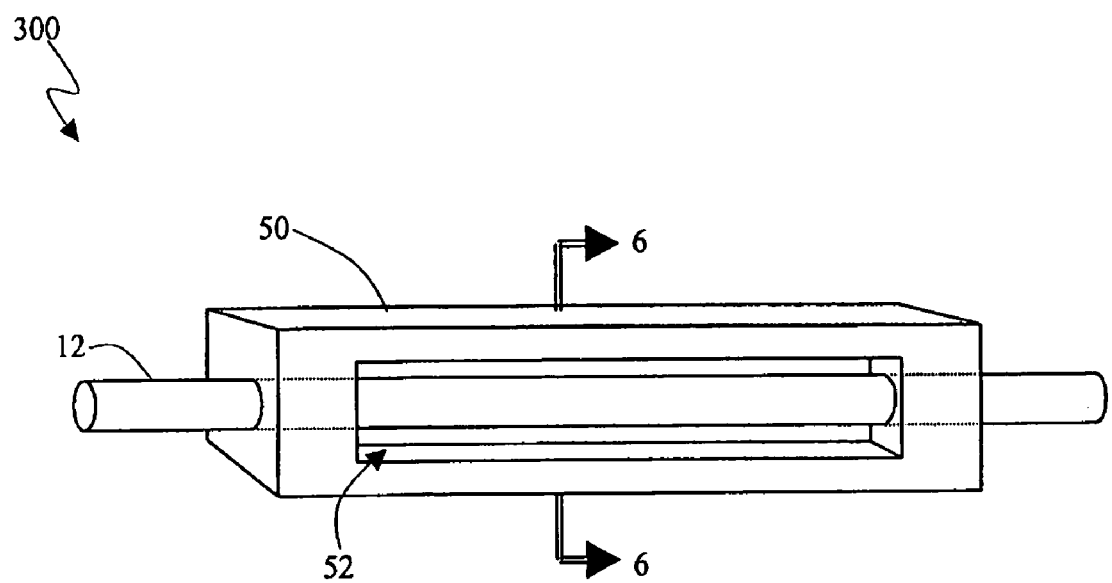
FIG. 5 is a perspective view of an alternate embodiment of a tensioning structure.
Figure 6:
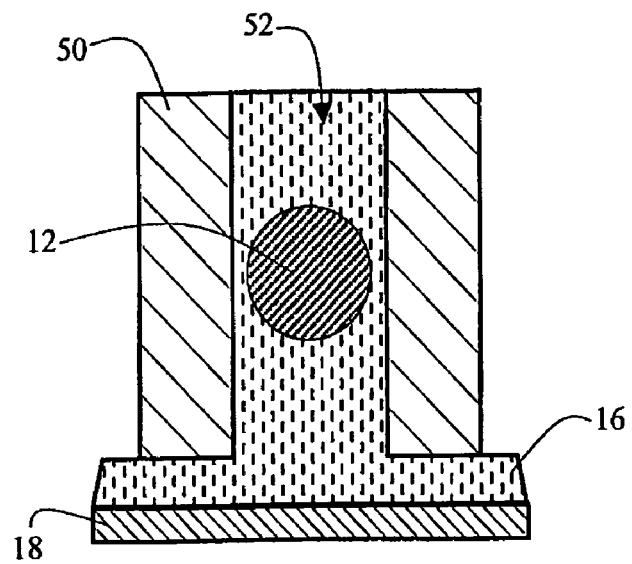
FIG. 6 is a cross sectional view of the tensioning structure of FIG. 5.

Alternately, in accordance with another aspect of the present invention, the tensioning structure may be implemented as an open structure, giving up some physical protection of the fiber optic component for enhanced thermal coupling. For example, as illustrated in FIG. 5, and indicated generally at 300, a tensioning structure main body 50 is fabricated of an electrically activated, mechanically-responsive material, for example, a piezoelectric material, with openings 52. Optionally, the interior of the main body and openings may be filled with a thermally-conductive, acoustic-damping material 16 as illustrated in the cross section view of FIG. 6. The thermally-conductive, acoustic-damping material further enhances the environmental isolation of the fiber optic component 12 by improving thermal coupling to the thermally-controlled surface 18.

Figure 7:
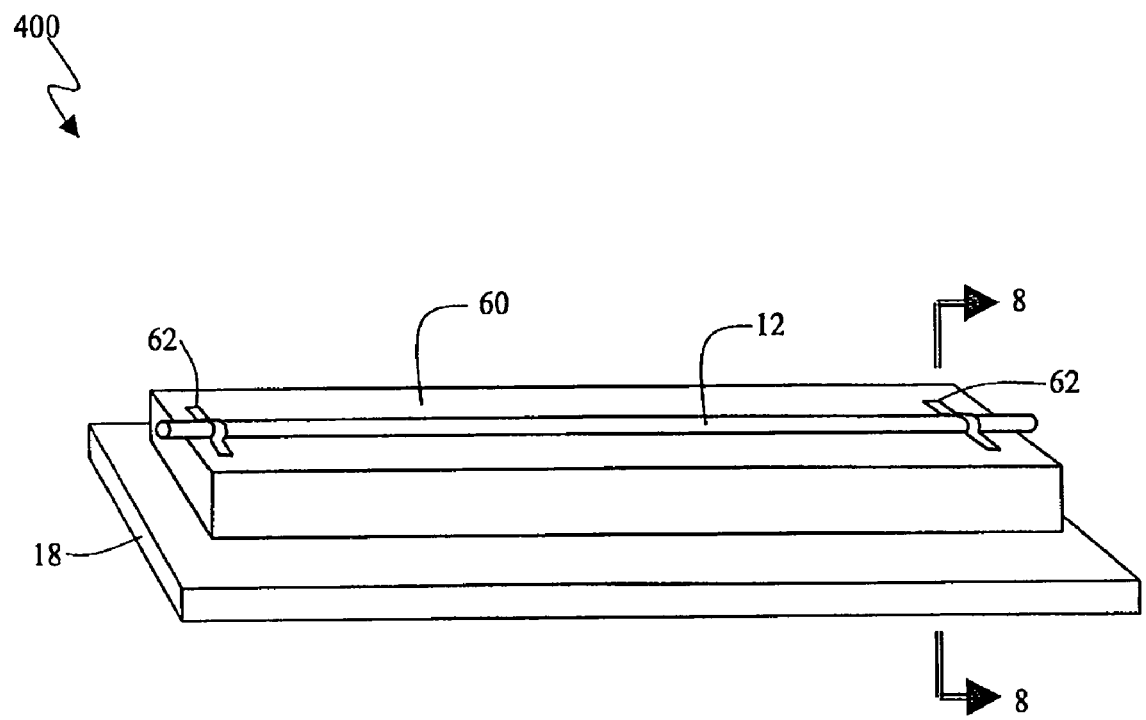
FIG. 7 is a perspective view of a simultaneously thermally and mechanically tunable fiber optic component with integrated physical protection and environmental isolation in accordance with an embodiment of the present invention.
Figure 8:
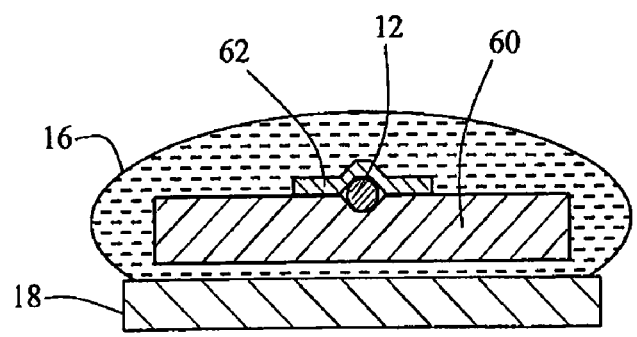
FIG. 8 is a cross sectional view of the device of FIG. 7.

In accordance with yet another aspect of the present invention, the tensioning structure may be implemented as a mounting plate. For example, as illustrated in FIG. 7, and indicated generally at 400, a tensioning structure main body 60 is fabricated of an electrically activated, mechanically-responsive material. Clamps 62, affixed to the main body hold the fiber optic component 12 at each end of the main body 60. The main body of the tensioning structure may be fabricated of a piezoelectric material, or a combination of piezoelectric and rigid material as previously described. FIG. 8 illustrates a cross section view of the main body, and shows optional thermally-conductive, acoustic-damping material 16 used to thermally attach an optional thermally-controlled surface 18. If thermal tuning is not required, an acoustic-damping material may be used instead of the thermally-conductive, acoustic-damping material. If mechanical tuning is not required, the tensioning structure may be omitted. Finally, if mechanical isolation is not required, a thermally-conductive material may be used instead of the thermally-conductive, acoustic-damping material.

An important aspect of the present invention is the length of the fiber optic component. For example, a DFB fiber laser will exhibit a mechanical natural frequency that depends on its length. Longer lasers exhibit a lower mechanical natural frequency; shorter lasers exhibit a higher mechanical natural frequency. If the mechanical natural frequency of the laser is too low, the mechanical tuning of the laser may perform poorly. Additionally, if the mechanical natural frequency of the laser is below about 20 kHz, the laser may be excessively responsive to acoustic vibration and mechanical shock, and it may prove difficult to maintain a stable optical frequency.

On the other hand, the optical gain and optical linewidth of the laser also depend on the length of the laser. Longer lasers provide greater optical gain and narrower optical linewidth; shorter lasers provide less optical gain and wider optical linewidth. Depending on the particular application, an optimal length may therefore exist which balances a desire for a relatively high mechanical natural frequency with a desire for relatively narrow optical linewidth. A DFB fiber laser length of about 15 mm has proven advantageous, although lengths of about 10 mm to 50 mm may also prove useful, depending upon the particular application.

In accordance with another aspect of the current invention, thermal tuning using the thermally-controlled surface 18 may be accomplished simultaneously with mechanical tuning using the tensioning structure 14. Mechanical tuning can provide small optical frequency changes at high rates; conversely, thermal tuning can provide large optical frequency changes at low rates. The combination of thermal tuning and mechanical tuning thus provides a wide optical frequency tuning range without encountering the problem of reduced reliability, since the mechanical strain on the laser is limited to a small range. Large optical frequency changes are accomplished using the thermal tuning, avoiding the need to overstress the fiber. The invention also avoids the limited tuning speed that thermal tuning alone provides by including simultaneous mechanical tuning. By combining both types of tuning in a single structure, the invention provides a more versatile fiber optic tuning structure using fewer parts. Furthermore, improved isolation from environmental effects, such as acoustic vibration, mechanical shock, and temperature variations is provided.

The simultaneous wide optical frequency range and rapid tuning rate of DFB fiber laser optical frequency provided by the present invention may be used to improve performance of optical systems. For example, when using resonant optical cavity injection, such as that disclosed by co-pending U.S. patent application Ser. No. 10/017,162, herein incorporated by reference, it is necessary that the laser optical frequency and cavity optical resonant frequency be precisely matched to obtain efficient operation. Both laser optical frequency and cavity optical resonant frequency can, however, be affected by a variety of factors, including temperature changes, mechanical drift and creep, mechanical shock, and acoustic vibration. This matching can be accomplished with the present invention, for example, by tuning the laser optical frequency to match the resonance of the cavity. Thermal tuning may adjust the DFB fiber laser optical frequency to match slow changes in the resonant frequency of the cavity optical resonant frequency caused by, for example, temperature changes, pressure changes, mechanical drift, or mechanical creep. Rapid mechanical tuning may adjust the DFB fiber laser optical frequency to match the rapid changes in cavity resonant frequency caused by, for example, acoustic vibration, mechanical vibration, or mechanical shock. Furthermore, thermal tuning may also be used to compensate any slow drift in the DFB fiber laser optical frequency caused by, for example, mechanical creep or ambient pressure changes.

Figure 9:
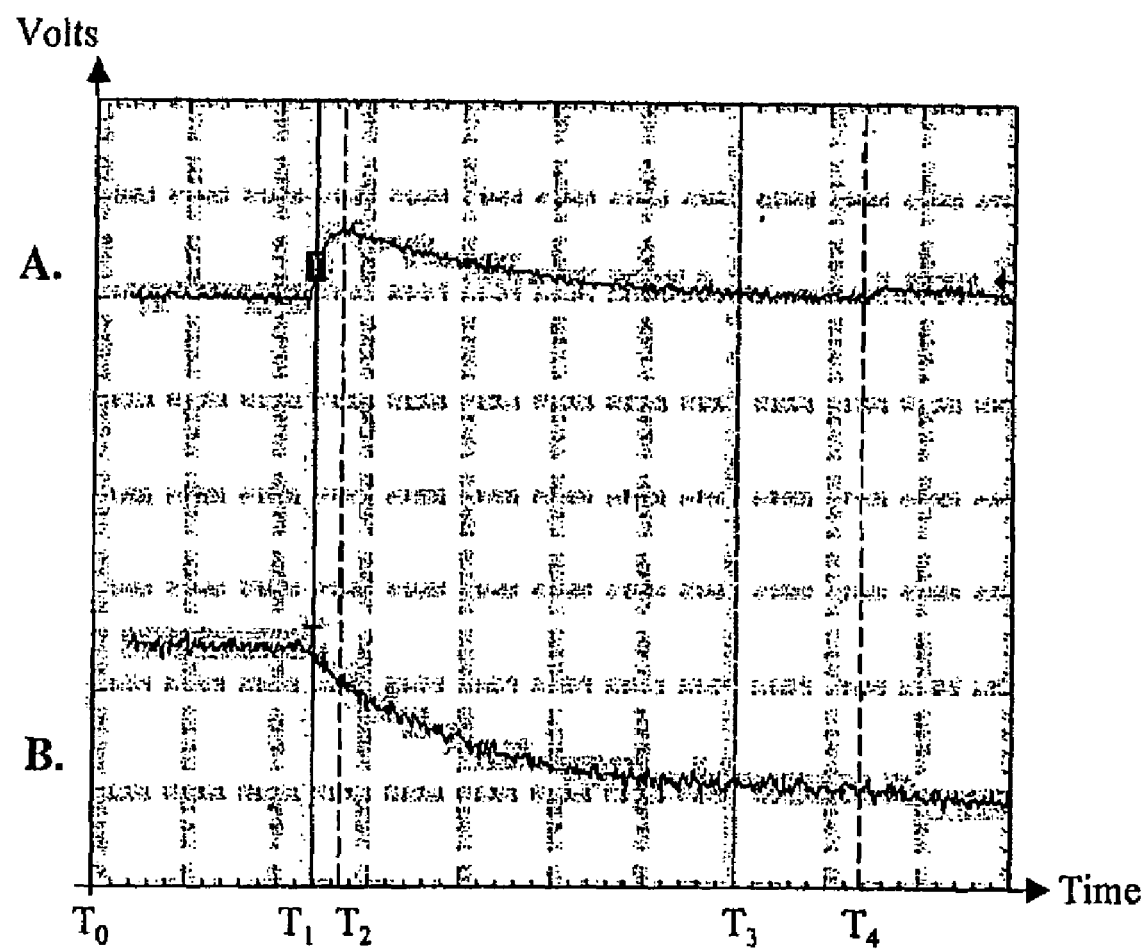
FIG. 9 is an illustration of the performance of a fiber optic laser tuner in accordance with an embodiment of the present invention.

For example, FIG. 9 illustrates the performance of a fiber optic laser tuner in accordance with an embodiment of the present invention. Both mechanical and thermal tuning of the laser were performed using a closed loop feedback system as described in U.S. patent application Ser. No. 10/017,162. The mechanical tuning loop bandwidth was set on the order of 100 kHz, and the thermal tuning loop bandwidth was set on the order of 1 Hz, although various other loop bandwidths may advantageously be used. The upper curve of FIG. 9, labeled A, shows the piezoelectric activation voltage, and the lower curve, labeled B, shows the thermal drive voltage. At time $T_0$, the system was initially frequency locked, and the mechanical loop piezoelectric activation voltage is approximately at center range. From time $T_1$ to $T_2$, the system is disturbed by perturbation, which is rapidly compensated by changes of the piezoelectric activation voltage, due to the relatively wide bandwidth of the mechanical tuning loop. From time $T_1$ to $T_3$, the thermal tuning loop slowly adjusts the thermal drive voltage to return the piezoelectric activation voltage back to center of its range. At time $T_4$, a smaller perturbation is compensated by the piezoelectric activation voltage.

It is to be understood that the above-referenced arrangements are illustrative of the application for the principles of the present invention. Numerous modifications and alternative arrangements can be devised without departing from the spirit and scope of the present invention while the present invention has been shown in the drawings and described above in connection with the exemplary embodiments(s) of the invention. It will be apparent to those of ordinary skill in the art that numerous modifications can be made without departing from the principles and concepts of the invention as set forth in the claims.

What is claimed is:

1. A tuning and isolating support device for a tunable fiber optic component, comprising:
    a) a fiber optic tensioning structure having at least opposing ends configured to rigidly attach to and along a common longitudinal axis with the tunable fiber optic component and formed of an electrically-active, mechanically-responsive material such that changes in dimension along the longitudinal axis arising from a first voltage applied to the tensioning structure yield corresponding dimensional changes in the fiber optic component to provide tunable adjustment of an optical frequency of the tunable fiber optic component; and
    b) a thermal control structure coupled to the tensioning structure to control temperature of the fiber optic component and provide changes in the optical frequency by adjustment of the temperature, said thermal control structure including:
        (i) a thermally-conductive, acoustic-damping material configured to minimize environmental vibration effects on the fiber optic component; and
        (ii) a thermally-controlled surface in thermal contact with the thermally-conductive acoustic-damping material, wherein the thermally-controlled surface varies in temperature and controls the temperature of the fiber optic component so that the fiber optic component optical frequency is tuned at least partially in response to a second applied voltage applied to the thermally-controlled surface.

2. The tuning and isolating support device of claim 1, wherein the tensioning structure is fabricated from a piezoelectric material.

3. The tuning and isolating support device of claim 1, wherein the tensioning structure comprises at least one section of a piezoelectric material and at least one section of a rigid material.

4. The tuning and isolating support device of claim 1, wherein the tensioning structure further comprises a longitudinal bore configured to receive the tunable fiber optic component.

5. The tuning and isolating support device of claim 4, further comprising acoustic-damping material disposed within the bore.

6. The tuning and isolating support device of claim 4, wherein the tensioning structure further comprises at least one radially disposed aperture connecting the bore to an outer surface of the tensioning structure.

7. The tuning and isolating support device of claim 4, further comprising:
    c) a first electrode located on a first surface of the fiber optic tensioning structure; and
    d) a second electrode located on a second surface of the fiber optic tensioning structure where the first and second electrodes are configured to apply the first voltage to the fiber optic tensioning structure.

8. The tuning and isolating support device of claim 7, wherein the first electrode is located on an inner surface of the fiber optic tensioning structure and the second electrode is located on an outer surface of the fiber optic tensioning structure so that the first voltage is applied radially to the tensioning structure.

9. The tuning and isolating support device of claim 4, further comprising a plug positioned within the end of the tensioning structure and having a hole configured to receive and rigidly attach to the fiber optic component.

10. The tuning and isolating support device of claim 1, further comprising the tunable fiber optic component longitudinally mounted and rigidly attached to the tensioning structure.

11. The tuning and isolating support device of claim 10, wherein the tunable fiber optic component comprises a conductive jacket used to provide an electrical connection to the tensioning structure.

12. The tuning and isolating support device of claim 10, wherein the fiber optic component is rigidly attached to the tensioning structure with glue.

13. The tuning and isolating support device of claim 10, wherein the fiber optic component is rigidly attached to the tensioning structure with clamps.

14. The tuning and isolating support device of claim 10, wherein the fiber optic component is configured as a distributed feedback fiber laser mounted with an active region of the distributed feedback fiber laser positioned substantially between the ends of the tensioning structure.

15. The tuning and isolating support device of claim 14 wherein a length of the distributed feedback fiber laser is optimally selected to provide a particular mechanical natural frequency and optical linewidth.

16. The tuning and isolating support device of claim 1, wherein the thermally-controlled surface comprises a resistive heater wire embedded within the thermally-conductive, acoustic-damping material.

17. The tuning and isolating support device of claim 1, wherein the thermally-controlled surface is selected from the group consisting of a thermoelectric cooler, a heat pump, and a heat exchanger.

18. The tuning and isolating support device of claim 1 wherein the tensioning structure has an operable bandwidth relative to the first voltage of about 0 to 500 kHz.

19. The tuning and isolating support device of claim 1 wherein the thermal control structure has an operable bandwidth relative to the second voltage of about 0 to 5 Hz.

* * * * *